(12) United States Patent
Ohata

(10) Patent No.: US 6,808,828 B2
(45) Date of Patent: Oct. 26, 2004

(54) ORGANIC ELECTROLUMINESCENT DISPLAY PANEL

(75) Inventor: Hiroshi Ohata, Yamagata-ken (JP)

(73) Assignee: Tohoku Pioneer Corporation, Yamagata-ken (JP)

(*) Notice: Subject to any disclaimer, the term of this patent is extended or adjusted under 35 U.S.C. 154(b) by 45 days.

(21) Appl. No.: 10/216,892

(22) Filed: Aug. 13, 2002

(65) Prior Publication Data

US 2003/0039859 A1 Feb. 27, 2003

(30) Foreign Application Priority Data

Aug. 23, 2001 (JP) ........................................ 2001-252505

(51) Int. Cl.$^7$ ............................................. H05B 33/04
(52) U.S. Cl. ..................... 428/690; 428/917; 313/512; 257/99; 257/100; 427/66; 156/327
(58) Field of Search ................. 428/690, 917, 428/68, 76; 313/512; 257/99, 100; 427/66; 156/327

(56) References Cited

U.S. PATENT DOCUMENTS

| | | | |
|---|---|---|---|
| 4,357,557 A | | 11/1982 | Inohara et al. |
| 6,081,071 A | * | 6/2000 | Rogers ........................ 313/512 |
| 6,226,890 B1 | * | 5/2001 | Boroson et al. .............. 34/472 |
| 2002/0050785 A1 | * | 5/2002 | Nakada et al. .............. 313/504 |
| 2002/0146533 A1 | * | 10/2002 | Chung et al. ................. 428/76 |
| 2002/0172839 A1 | * | 11/2002 | Van Hal et al. ............ 428/690 |
| 2003/0122476 A1 | * | 7/2003 | Wang et al. ................ 313/493 |
| 2003/0143423 A1 | * | 7/2003 | McCormick et al. ....... 428/690 |

FOREIGN PATENT DOCUMENTS

| | | |
|---|---|---|
| EP | 0 545 558 A | 6/1993 |
| EP | 1 014 758 A2 * | 6/2000 |
| EP | 1 115 267 A | 7/2001 |

OTHER PUBLICATIONS

Database WPI, Section Ch, Week 200134, Derwent Publications Ltd., London, GFB; AN 2001–257527, XP002222633, Abstract of WO 2001/2745.

European Search Report, Application No. EP 02 01 8373, report dated Nov. 27, 2002.

* cited by examiner

Primary Examiner—Dawn L. Garrett
(74) Attorney, Agent, or Firm—Arent Fox

(57) ABSTRACT

Provision of an organic electroluminescent display panel having an increased life span and a decreased thickness. The organic electroluminescent display panel comprises an organic layer formed on a glass substrate, a sealing member provided on the substrate for covering the organic layer. A drying agent is provided inside the sealing member, also provided inside the sealing member is an initial moisture absorbent constituted by a photopolymerization initiator-containing resin capable of absorbing moisture by a photopolymerization reaction. Immediately after the sealing member is attached, the initial moisture absorbent is allowed to produce an effect of removing the initial moisture existing inside the sealing member.

5 Claims, 3 Drawing Sheets

ORGANIC ELECTROLUMINESCENT DISPLAY PANEL

BACKGROUND OF THE INVENTION

The present invention relates to an organic electroluminescent (EL) display panel comprising a transparent substrate having formed thereon an organic layer including a light emitting layer. This invention also relates to a method of manufacturing the organic electroluminescent display panel.

The present application claims priority from Japanese Patent Application No. 2001-252505, the disclosure of which is incorporated herein by reference for all purposes.

Typically, an organic EL display panel is basically formed by a plurality of organic EL elements mounted on a transparent glass substrate. Each organic EL element is composed of: an anode formed by transparent electrode of ITO or the like and supported on the transparent glass substrate; an organic layer containing a light emitting layer formed of organic compounds and mounted on the transparent anode electrode; and a cathode constituted by metal electrode of Al or the like and formed on the organic layer. These organic EL elements serving as unit surface-light-emitting elements are arranged over the plane substrate to provide an image display.

It is known that the properties of an organic EL display panel will get deteriorated when its organic layer and the electrodes are exposed to the air. This is because of a phenomenon in which if moisture enters an interface between the organic layer and the electrodes, the moisture will interfere with the injection of electrons and thus produce a dark spot which is a non-emitting area, or it will cause corrosion of the electrode. In order to ensure the stability and durability of each organic EL element, a sealing technique for blocking each organic EL element from the air is thus absolutely indispensable. According to a sealing technique generally adopted today, a sealing member is bonded by means of an adhesive layer onto the transparent glass substrate having formed thereon the electrodes and the organic layer, so as to cover the electrodes and the organic layer.

FIG. 3 illustrates an example of such conventional organic EL display panel comprising a transparent glass substrate on which a sealing member is bonded. As shown in the drawing, an organic layer 42 is formed on a glass substrate 41, and a sealing member 44 is bonded by means of an adhesive layer 43 onto the glass substrate 41 so as to cover the organic layer 42. The sealing member 44 is provided with a pocket 44a to hold a drying agent 45.

The drying agent 45 is provided for absorbing and removing initial moisture existing inside the sealing member 44 after the sealing member 44 has been bonded to the glass substrate, as well as any other moistures dissipated or entered therein with the passing of time. This is because the organic layer, which is especially susceptible to heat attach, makes it impossible to perform heat treatment for completely removing moisture prior to the bonding process. As a result, the above moistures cannot be completely eliminated. For this reason, provision of the drying agent 45 within the sealing member 44 is indispensable to a display panel using current organic EL materials. Some exemplary substances which can be used as the drying agent 45 are CaO, BaO, or the like which can chemically absorb moisture, or silica gel (or the like) which can physically absorb moisture.

According to the aforementioned prior art, the sealing member needs a thickness T in order to provide a pocket for installing the drying agent, and therefore there is a problem that the thickness of the entire organic EL display panel has to be increased. On the other hand, since an organic EL display panel is intended to be used as a display of a portable information terminal such as a portable telephone (also PDA and the like), a display panel with a reduced thickness is particularly highly required. Accordingly, it is necessary to minimize the size of a drying agent.

Usually, a drying agent is required to act to absorb initial moisture existing inside the sealing member immediately after the bonding process, and to absorb moisture dissipated during the driving of the organic EL display panel or the moisture entering from outside during use. Accordingly, if the drying agent is too small in size, its moisture absorbing capability will be quickly used up in absorbing the initial moisture, and its action of absorbing the subsequent moisture produced thereafter will further decrease, leading to a problem of significantly shortening the usable life span of the organic EL display panel.

SUMMARY OF THE INVENTION

The present invention has been accomplished in order to solve the aforementioned problems existing in the above-discussed prior art, and it is an object of the invention to provide an improved organic EL display panel having an elongated life span but a reduced thickness, as well as a method of manufacturing the organic EL display panel.

To attain the above object, an organic EL display panel according to the present invention has the following features.

According to a first aspect of the invention, there is provided an organic electroluminescent display panel including a transparent substrate, an organic layer formed on the transparent substrate, an adhesive layer formed around the organic layer, and a sealing member bonded to the transparent substrate by means of the adhesive layer for covering the organic layer, characterized in that: a photopolymerization initiator-containing resin capable of absorbing moisture by a photopolymerization reaction, is placed inside said sealing member, and has been radiated with a light and thus polymerized.

According to a second aspect of the invention, based on the first aspect thereof, the adhesive layer comprises an ultraviolet-setting adhesive agent, and said photopolymerization initiator-containing resin is formed into a layer located along the adhesive layer.

According to a third aspect of the invention, based on the first or second aspect thereof, the panel further comprises a drying agent placed inside the sealing member and capable of chemically or physically absorbing a moisture enclosed therein.

According to a fourth aspect of the invention, there is provided a method of manufacturing an organic EL display panel, including the steps of: forming an organic layer on a transparent substrate; forming a light-setting resin layer serving as an adhesive around the organic layer by coating or printing; and bonding a sealing member for covering said organic layer to the transparent substrate by means of said adhesive layer. This method further comprises the steps of: forming a photopolymerization initiator-containing resin layer capable of absorbing moisture by a photopolymerization reaction, said resin layer being located along inner edges of said adhesive layer inside said sealing member and formed by coating or printing; and irradiating said adhesive resin layer and said photopolymerization initiator-containing resin layer with a light to simultaneously effect the curing of the adhesive resin layer and the photopolymerization of the photopolymerization initiator-containing resin layer.

According to a fifth aspect, based on the manufacturing method of the fourth aspect, the sealing member is formed by a transparent material and said photopolymerization initiator-containing resin layer is formed on the inner surface of the sealing member. The method further comprising the step of attaching a drying agent to the inner surface of said sealing member at a position surrounded by said photoplymerization initiator-containing resin layer for chemically or physically absorbing moisture enclosed therein, followed by irradiating with an ultraviolet light through said sealing member.

The present invention having the above feature has the following advantages.

According to the first aspect of the invention, the photopolymerization initiator-containing resin layer capable of absorbing moisture by a photopolymerization reaction is placed inside the sealing member of the organic EL display panel. Therefore, immediately after the sealing member is bonded to the substrate, the photopolymerization initiator-containing resin layer undergoes photopolymerization to absorb the initial moisture existing inside the sealing member. In this way, the initial moisture can be promptly removed immediately after the bonding process. This prompt removal of the initial moisture makes it possible to minimize an influence of moisture produced at a later time in the organic EL display panel, resulting in an elongated life span for the organic EL display panel. In addition, the prompt removal of the initial moisture makes it possible to minimize the size of the drying agent, thereby reducing the thickness of the organic EL display panel.

According to the second aspect of the invention, by forming the photopolymerization initiator-containing resin layer along the adhesive layer, the light radiation can be efficiently applied to both the adhesive layer and the photopolymerization initiator-containing resin layer.

According to the third aspect of the invention, the photopolymerization initiator-containing resin layer initiates photopolymerization to absorb the initial moisture to thereby effectively remove it immediately after completion of the bonding process. Accordingly, the drying agent placed inside the sealing member is required to remove only the moisture entering thereafter, making it possible to minimize the size of the drying agent. Thus, it becomes possible for an organic EL display panel having a reduced thickness to provide an adequate life span.

According to the fourth aspect of the invention, which is a method of manufacturing the organic EL display panel having the aforementioned features, the photopolymerization initiator-containing resin layer capable of absorbing moisture by the photopolymerization reaction is formed along the inner edges of the adhesive layer inside the sealing member by coating or printing, and the adhesive layer as well as the photopolymerization initiator-containing resin layer are irradiated with a light at one time. In this way, the initial moisture can be absorbed through the aforementioned photopolymerization when the adhesive is cured, rendering it possible to omit an extra step of irradiation with light for absorbing the initial moisture.

According to the fifth aspect of the invention, the sealing member is formed by a transparent material and said photopolymerization initiator-containing resin layer is formed on the inner surface of the sealing member. The method further comprising the step of attaching a drying agent to the inner surface of said sealing member at a position surrounded by said photoplymerization initiator-containing resin layer for chemically or physically absorbing moisture enclosed therein, followed by irradiating with an ultraviolet light through said sealing member. Therefore, the curing of the adhesive resin layer and the photopolymerization of the photopolymerization initiator-containing resin layer can be effected during only one operation of the ultraviolet radiation. In addition, the drying agent functions as a mask, so that the light radiation does not cause deterioration of the organic layer even if an extra mask is not used. Further, providing the photopolymerization initiator-containing resin layer on the sealing member eliminates a dead space on the transparent substrate, and therefore an effective display area is ensured.

These and other objects and features of the present invention will become more apparent from the following detailed description with reference to the accompanying drawings.

DETAILED DESCRIPTION OF THE PREFERRED EMBODIMENT

Figure 1:
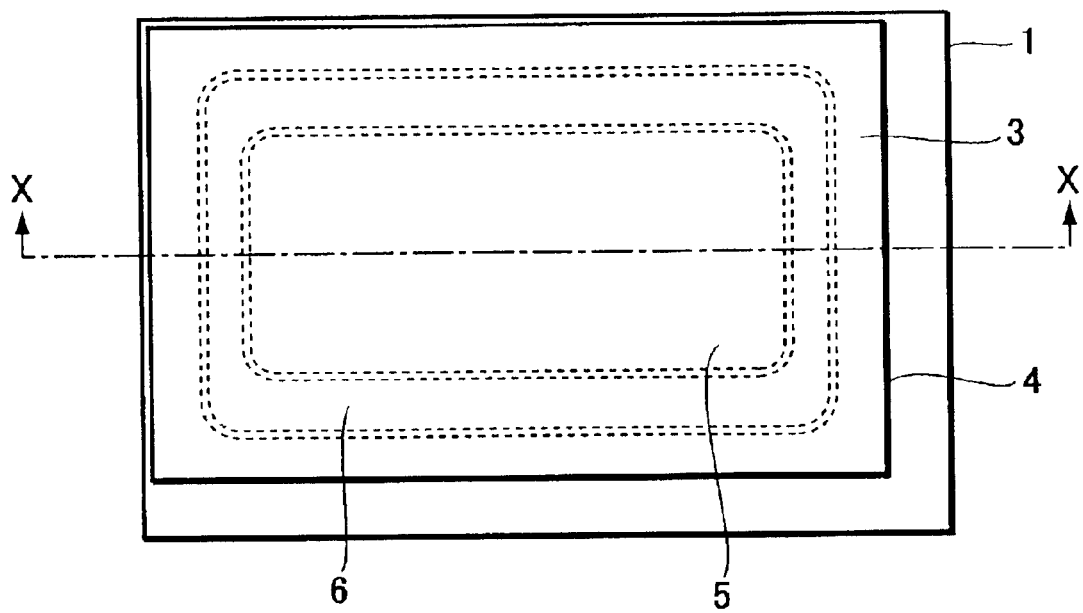
FIGS. 1A and 1B are a plan view and a sectional view illustrating an organic EL display panel according to a preferred embodiment of the present invention.
Figure 1:
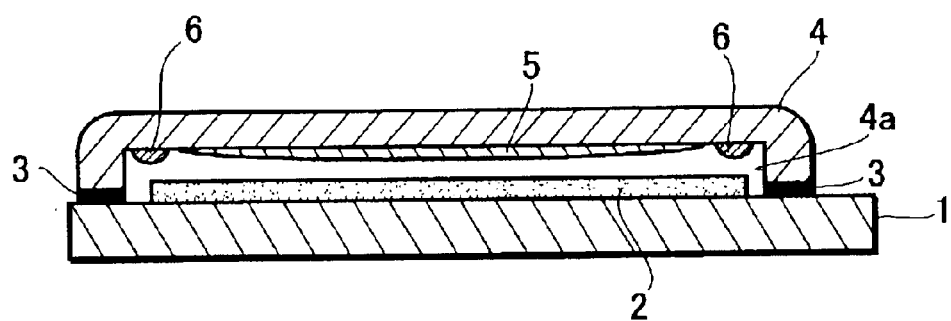

A preferred embodiment according to the present invention will be described hereinafter with reference to the accompanying drawings. FIG. 1A is an explanatory plan view of an organic EL display panel according to the preferred embodiment of the present invention, and FIG. 1B is a sectional view taken along the X—X line in FIG. 1A. In FIGS. 1A and 1B, an organic layer 2 is placed on a glass substrate 1. The organic layer 2 is formed by laminating: anodes (not shown) constituted by transparent electrodes of ITO or the like and formed on the glass substrate 1; a hole injection layer of copper phthalocyanines; a hole transporting layer of TDP or the like; a light-emitting layer or electron transporting layer of $Alq_3$ or the like; an electron injection layer of $LiO_2$; and cathodes (not shown) of Al or the like.

The glass substrate 1 is bonded through an adhesive layer 3 with a glass-made sealing member 4. The adhesive layer 3 is formed by an ultraviolet setting resin such as an epoxy resin and located around the organic layer 2. The sealing member 4 has an inner face 4a on which a drying agent 5 is adhered. The drying agent 5 may either be a substance such as CaO, BaO or the like that chemically absorbs moisture, or silica gel or the like that physically absorbs moisture.

In the present embodiment, an initial moisture absorbing layer 6 is formed along the inner sides of the adhesive layer 3 on the inner surface 4a of the sealing member 4. The initial moisture absorbing layer 6 comprises a photopolymerization initiator-containing resin capable of absorbing moisture by virtue of a photopolymerization reaction. For example, it is allowed to use an epoxy resin and a radical or a cationic photopolymerization initiator. Examples of a radical photopolymerization initiator include: diethoxy acetophenone;

benzophenone; benzyl; benzoin isobutyl ether; benzyl dimethyl ketal; 1-hydroxycyclohexyl phenyl ketone; diethylthioxantone; 2-ethylanthraquinones; 2-hydroxy-2-methyl-1-phenylpropane-1-one; 1-(4-isopropylphenyl)-2-hydroxy-2-methylpropane-1-one; 2-methyl-[4-(methylthio)phenyl]-2-morpholino-1-propane; and the like. Examples of a substance used as a cationic photopolymerization initiator include aromatic diazonium salts, triallyl sulfonium salts, diallyl iodonium salts, triallyl selenium salts (all of which are salts of Lewis acid), a metallocene compound and the like.

Figure 2:
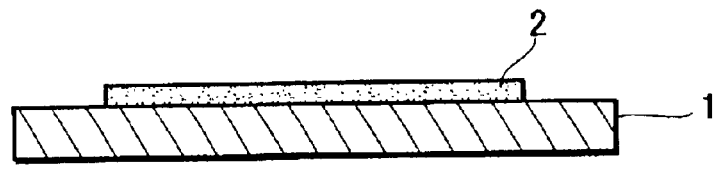
FIGS. 2A to 2C are sectional views explaining a method of manufacturing an organic EL display panel according to the embodiment of the present invention.
Figure 2:
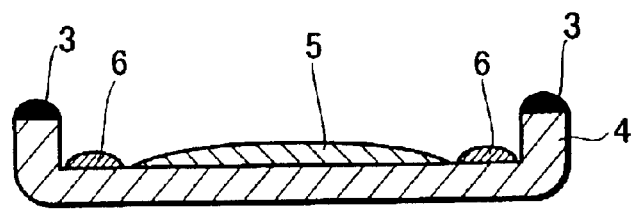
Figure 2:
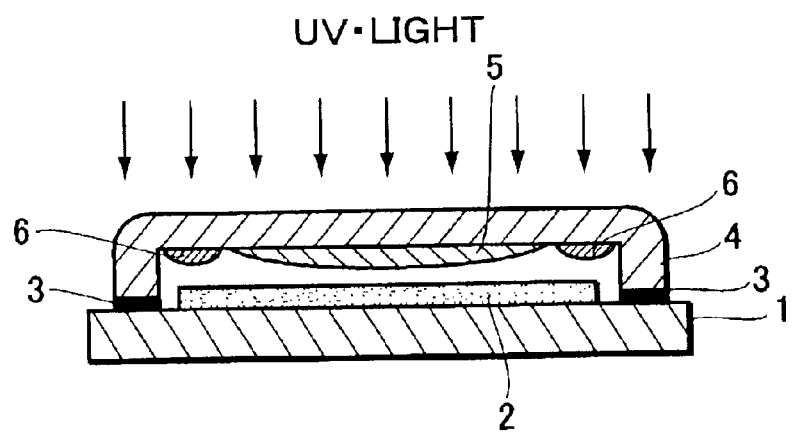
Figure 3:
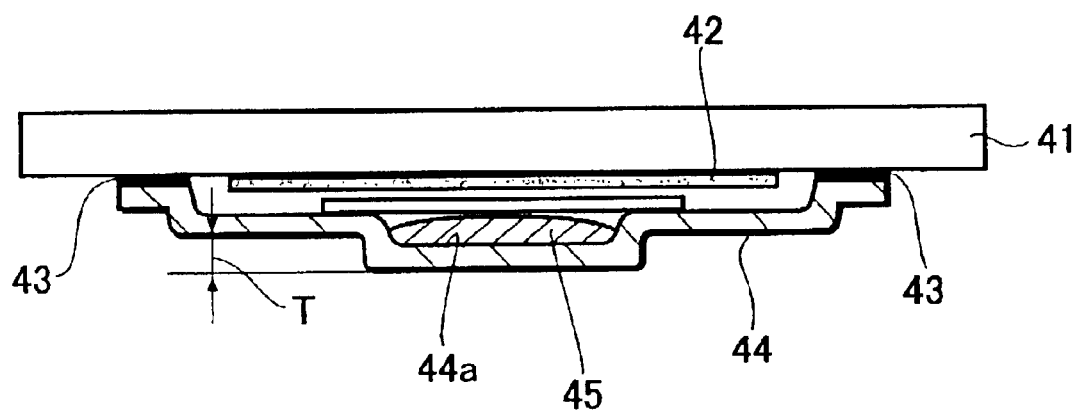
FIG. 3 is a sectional view illustrating a conventional organic EL display panel.

Next, a description will be given to explain a method of manufacturing an organic EL display panel according to a preferred embodiment of the invention, with reference to FIGS. 2A to 2C. FIG. 2A illustrates a state of the organic layer 2 formed on the glass substrate 1. For forming the organic layer 2, transparent electrodes of ITO or the like are formed as anodes on the glass substrate 1. Then, a hole injection layer, a hole transporting layer, a light-emitting layer, an electron transporting layer, an electron injection layer and the like are laminated successively on the transparent electrodes by vacuum deposition. Afterwards, electrodes of Al or the like serving as cathodes are deposited onto the resulting laminated layers.

FIG. 2B illustrates a state of the sealing member 4 on which the adhesive layer 3, the drying agent 5 and the initial moisture absorbing layer 6 are formed. The adhesive layer 3 is formed on the bonding face of the sealing member 4 by coating (using a dispenser or the like), or by printing such as screen printing. The drying agent 5 is mixed into a resin, or solidified and has one face thereof coated with an adhesive, so as to be bonded as a thin-film to the inner face 4a of the sealing member 4. The initial moisture absorbing layer 6 is a mixture of the aforementioned resin and photopolymerization initiator, applied or printed on the inner face 4a of the sealing member 4. Specifically, the layer 6 is formed along the inner sides of the adhesive layer 3 so as to surround the drying agent 5.

As shown in FIG. 2C, the resulting sealing member 4 is then mounted on the glass substrate 1 so as to cover the organic layer 3. Then, ultraviolet radiation is applied through the sealing member 4 as indicated by the arrows in FIG. 2C in order to cure the adhesive layer 3 and cause the initial moisture absorbing layer 6 to start photopolymerization so as to absorb initial moisture existing immediately after the bonding process.

With this method, the initial moisture absorbing layer 6 produces an effect immediately after the sealing member 4 is bonded around the organic layer 2, so as to effectively remove the initial moisture existing inside the sealing member 4. By removing the initial moisture, it is possible to reduce the moisture dissipated into a space inside the sealing member 4 at a later time (when the organic EL display panel has been driven and the interior of the panel enclosed by the sealing member 4 has been in an elevated temperature environment), thereby allowing the drying agent 5 to be set at a low level of an absorbing activity. In this way, an amount of drying agent 5 is allowed to be reduced, so that only a thin-thickness drying agent 5 is needed for ensuring an adequate life span for the display panel. Further, since a thin-thickness drying agent 5 is enough for ensuring an adequate life span for a display panel, a need for providing a pocket as in the prior art can be eliminated, thereby resulting in a decrease in the thickness of the display panel.

Further, in the present embodiment, the sealing member 4 is made of glass, the initial moisture absorbing layer 6 is provided along the inner sides of the adhesive layer 3 and the drying agent 5 is adhered to the sealing member 4 at a position surrounded by the absorbing layer 6. With this arrangement, both the curing of the adhesive layer 3 and the photopolymerization of the initial moisture absorbing layer 6 may be simultaneously effected by applying an ultraviolet radiation from above the sealing member 4. And also, since the drying agent 5 functions as a mask, the organic layer 2 is prevented from deterioration (which will possibly be caused due to the ultraviolet radiation), thus making it possible to dispense with an extra mask. Further, providing the initial moisture absorbing layer 6 on the sealing member 4 eliminates a dead space on the glass substrate 1, thereby effectively ensuring a desired display area.

Using a glass to make the sealing member 4 significantly reduces the weight of the sealing member as compared with a conventional metal-made sealing member.

According to the above-discussed embodiment, the adhesive layer 3 and initial moisture absorbing layer 6 are placed on the sealing member 4. However, if either or both of the layers 3 and 6 are placed on the glass substrate 1, it is still possible to increase the life span and reduce the thickness of a display panel, as described above.

The aforementioned embodiment provides the drying agent 5, but if the initial moisture absorbing layer 6 can completely remove the initial moisture, and if the subsequent entry of moisture from outside is avoidable by enhancing the sealing effect, a similar long life span of the panel can be ensured without providing the drying agent 5. In this case, the sealing member 4 can be further reduced in its thickness, resulting in a display panel compact in size.

The present invention is formed as described above, in which an initial moisture absorbing layer (constituted by a photopolymerization initiator-containing resin which absorbs moisture through a photopolymerization reaction) is placed inside a sealing member and is allowed to produce its effect after completion of the bonding process. Therefore, a longer life span of an organic EL display panel is achieved because of an effective and immediate removal of initial moisture existing inside the sealing member. Further, reduction in the thickness of the panel is achieved by minimizing the size of a drying agent.

The terms and description used herein are set forth by way of illustration only and are not meant as limitations. Those skilled in the art will recognize that numerous variations are possible within the spirit and scope of the invention as defined in the following claims.

What is claimed is:

1. An organic electroluminescent display panel including a transparent substrate, an organic layer formed on the transparent substrate, an adhesive layer formed around the organic layer, and a sealing member bonded to the transparent substrate by means of the adhesive layer for covering the organic layer, characterized in that:

a photopolymerization initiator-containing resin capable of absorbing moisture by a photopolymerization reaction, is placed inside said sealing member, and has been radiated with a light and thus polymerized.

2. An organic electroluminescent display panel according to claim 1, wherein said adhesive layer comprises an ultraviolet-setting adhesive agent, and said photopolymerization initiator-containing resin is formed into a layer located along the adhesive layer.

3. An organic electroluminescent display panel according to claim 1 or claim 2, further comprising a drying agent placed inside the sealing member and capable of chemically or physically absorbing a moisture enclosed therein.

4. A method of manufacturing an organic electroluminescent display panel including the steps of: forming an organic layer on a transparent substrate; forming a light-setting resin layer serving as an adhesive around the organic layer by coating or printing; and bonding a sealing member for covering said organic layer to the transparent substrate by means of said adhesive layer, said method further comprising the steps of:

forming a photopolymerization initiator-containing resin layer capable of absorbing moisture by a photopolymerization reaction, said resin layer being located along inner edges of said adhesive layer inside said sealing member and formed by coating or printing; and irradiating said adhesive resin layer and said photopolymerization initiator-containing resin layer with a light to simultaneously effect the curing of the adhesive resin layer and the photopolymerization of the photopolymerization initiator-containing resin layer.

5. A method of manufacturing an organic electroluminescent display panel according to claim 4, wherein said sealing member is formed by a transparent material and said photopolymerization initiator-containing resin layer is formed on the inner surface of the sealing member, said method further comprising the step of attaching a drying agent to the inner surface of said sealing member at a position surrounded by said photopolymerization initiator-containing resin layer for chemically or physically absorbing moisture enclosed therein, followed by irradiating with an ultraviolet light through said sealing member.

* * * * *